United States Patent
Numai

(10) Patent No.: US 6,501,776 B1
(45) Date of Patent: Dec. 31, 2002

(54) TEMPERATURE-INSENSITIVE SEMICONDUCTOR LASER

(75) Inventor: Takahiro Numai, Ninomiya-machi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/492,337

(22) Filed: Jan. 27, 2000

(30) Foreign Application Priority Data

| Jan. 29, 1999 | (JP) | 11-020855 |
| Jan. 29, 1999 | (JP) | 11-020857 |
| Jan. 29, 1999 | (JP) | 11-020861 |

(51) Int. Cl.⁷ .............................................. H01S 5/00
(52) U.S. Cl. ............................................ 372/45; 372/46
(58) Field of Search ....................... 372/43–50

(56) References Cited

U.S. PATENT DOCUMENTS 5,939,733 A * 8/1999 Sato ........................ 372/45

FOREIGN PATENT DOCUMENTS

| JP | 08-316578 A | * 11/1996 | ............. H01S/3/18 |
| JP | 9-219561 | 8/1997 | |

* cited by examiner

Primary Examiner—Quyen Leung
(74) Attorney, Agent, or Firm—Fitzpatrick, Cella, Harper & Scinto

(57) ABSTRACT

A semiconductor laser includes a substrate, semiconductor layers formed on the substrate, which construct a cavity including a waveguide with an active region and include at least one semiconductor layer whose refractive-index temperature coefficient is set at a non-positive or minute value sufficient to achieve at least one of the functions of stabilizing an oscillation wavelength of the semiconductor laser and suppressing an overflow of carriers from the active region, and a driving unit for causing electron-hole recombination in the active region.

11 Claims, 11 Drawing Sheets

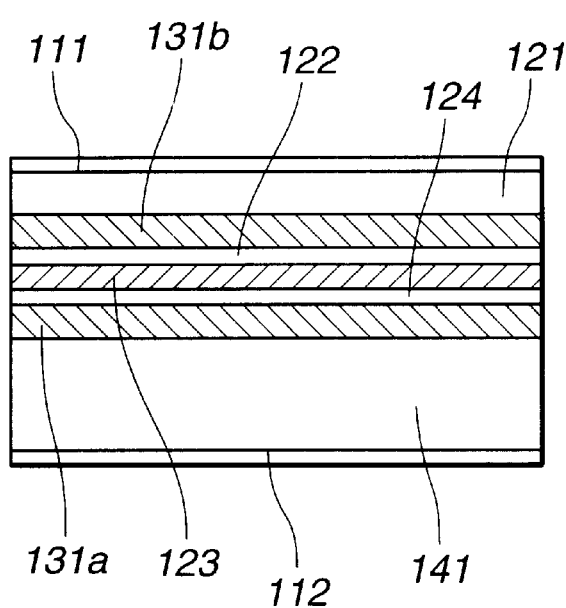 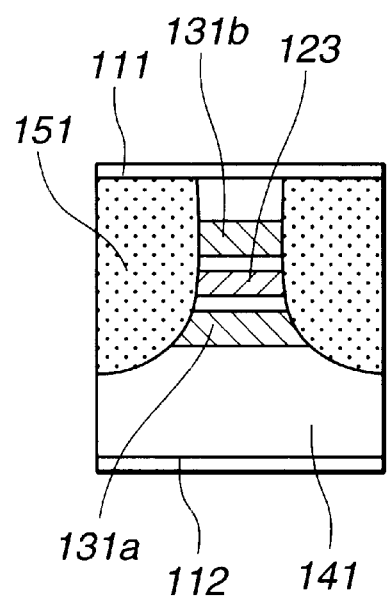
FIG.6A  FIG.6B

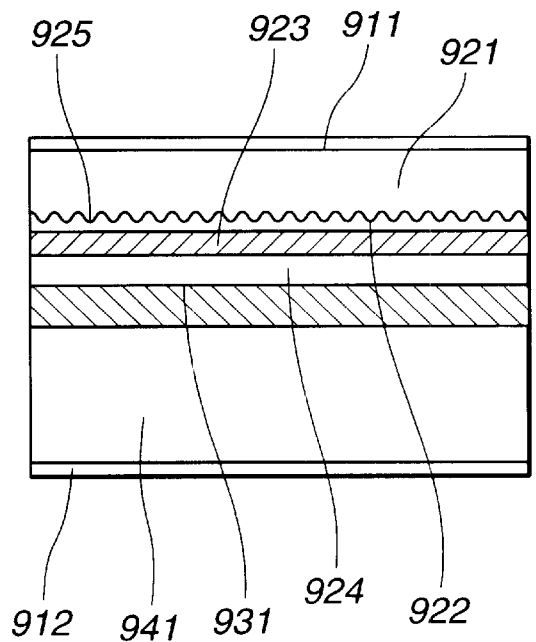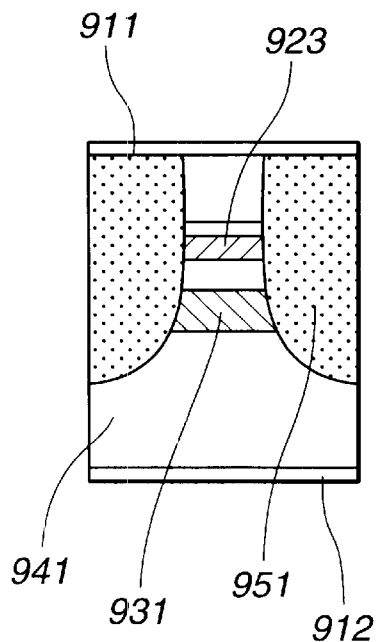
FIG.14A
FIG.14B

TEMPERATURE-INSENSITIVE SEMICONDUCTOR LASER

BACKGROUND OF THE INVENTION

1. Field of the Invention

This invention relates to a temperature-insensitive semiconductor laser, such as a wavelength-stabilized semiconductor laser and a semiconductor laser having a high characteristic temperature, which can be preferably employed as a light source in a wavelength division multiplexing optical communication system and the like.

2. Related Background Art

In general, the oscillation wavelength of a semiconductor laser (a laser diode (LD)) is likely to vary depending on its ambient temperature. When the temperature changes, spacings between atoms and magnitudes of lattice vibrations vary in semiconductor crystals, and hence, the energy bandgap and refractive index thereof change. For this reason, the oscillation wavelength of the LD changes. Generally, the refractive index decreases as the bandgap increases.

A waveguide-type Fabry-Perot LD has a large number of resonance modes (longitudinal modes) in its gain spectrum, and oscillates at a wavelength of the resonance modes that is the closest wavelength to a wavelength at the gain peak. This resonance wavelength is proportional to an effective refractive index of a light waveguide when the effective refractive index is approximately uniform over the entire waveguide, while proportional to an optical length of its entire cavity when the effective refractive index varies along the waveguide. The gain-peak wavelength changes depending on the shape of its energy band structure. As a result, the oscillation wavelength of the Fabry-Perot LD depends on both the energy band structure and the refractive index (or the optical length of the cavity).

On the other hand, the oscillation wavelength of a distributed feedback semiconductor laser (DFB-LD) is determined by a pitch of its built-in diffraction grating and an effective refractive index of its light waveguide, provided that reflectivities at its end facets are negligibly low. In other words, its oscillation wavelength is independent of a wavelength at its gain peak. Thus, this oscillation wavelength is influenced only by the refractive index since the physical pitch is fixed. Naturally, no oscillation occurs when a difference between the gain-peak wavelength and the resonance wavelength is too large to obtain the oscillation threshold gain at the resonance wavelength. It does not, however, mean that the oscillation wavelength is under the influence of the wavelength at the gain peak.

Optical-fiber commmunication recently has been used in subscriber systems as well, as in trunk line systems as the information capacity has increased. The semiconductor laser of such subscriber systems is often used as a light source in hostile environments, such as a place where the temperature greatly changes, in contrast to that of the trunk line systems. Further, the demand for using such a semiconductor laser without any temperature controller has increased, because it reduces the cost.

Wavelength division multiplexing (WDM) transmission exists as a method for increasing the information transmission capacity. In WDM transmission, multiplexed wavelength signals must be precisely stabilized. Therefore, there is a need for a semiconductor laser, whose wavelength is stable even in a hostile atmosphere, such that the WDM transmission can be widely employed even in subscriber systems. Japanese Patent Application Laid-Open No. 9(1997)-219561 discloses such a wavelength-stabilized semiconductor laser.

In a device of this disclosure, its active layer and light guiding layer are composed of material whose bandgap (i.e., its refractive index) remains unchanged even when the temperature changes. Accordingly, where crystals are to be formed without any large difference between their lattice constants such that no inelastic strain is introduced therein, a combination of crystal materials must be selected from a narrow range since the lattice matching needs to be approximately attained between those crystals. Further, since laser light extends further to its substrate and cladding layer, it is impossible to maintain the effective refractive index of its light waveguide at a constant value when the temperature changes.

SUMMARY OF THE INVENTION

It is an object of the present invention to provide a temperature-insensitive semiconductor laser wherein one kind or a small number of kinds of materials constitute a layer structure, which is introduced to stabilize its cavity length or its effective refractive index of its waveguide, such that a change in its oscillation wavelength is satisfactorily small irrespective of a fluctuation in the temperature of the semiconductor laser.

Another object of the present invention is to provide a semiconductor laser wherein an overflow of carriers is suppressed against a fluctuation in the temperature of the semiconductor laser and its oscillation threshold current is thus stabilized.

The present invention is generally directed to a semiconductor laser which includes a substrate, semiconductor layers which are formed on the substrate and define a cavity including a waveguide with an active region, and which include at least one semiconductor layer whose refractive-index temperature coefficient is set at a non-positive or minute value to achieve at least one function of stabilizing a wavelength of the semiconductor laser and suppressing an overflow of carriers from the active region, and a driving unit for causing electron-hole recombination in the active region.

There are three configurations of the present invention, based on the above fundamental construction.

In accordance with a first configuration of the present invention, there is provided a semiconductor laser wherein the semiconductor layers formed on the substrate include at least one semiconductor layer whose temperature coefficient of the refractive-index (also referred to as a refractive-index temperature coefficient in this specification) is set at a negative value to achieve at least one of the functions of approximately maintaining an optical length of the cavity or an effective refractive index of the waveguide at a constant value against a change in the temperature of the semiconductor laser and suppressing an oscillation threshold current injected into the active region by the driving unit, such as a current-injecting unit, against a change in the temperature of the semiconductor laser.

The principle of the first configuration will be described in detail below. When a semiconductor layer with a negative refractive-index temperature coefficient is arranged in a laser-light existing region of the laser, both the above functions can be achieved. In contrast, when a semiconductor layer with a negative refractive-index temperature coefficient is arranged in a region of the laser where no laser light exists, only the above function of suppressing the oscillation threshold current injected into the active region against a change in the temperature of the laser can be achieved.

More specifically, the following specific structures are possible in the first configuration. The semiconductor layers formed on the substrate may include in the laser-light existing region a first semiconductor layer whose refractive-index temperature coefficient is set at a positive value and a second semiconductor layer whose refractive-index temperature coefficient is set at a negative value to achieve the function of approximately maintaining the optical length of the cavity or the effective refractive index of the waveguide at a constant value against a change in the temperature of the laser. In this structure, the cavity length or the effective refractive index of the waveguide can be maintained approximately unchanged, and the oscillation wavelength can be hence stabilized.

The first semiconductor layer and the second semiconductor layer may be placed in an approximately parallel manner along a growth direction in the laser-light existing region. This relates to a structure wherein a compensation layer is disposed along the growth direction. The compensation layer will be described below in the description of the principle. This structure can be readily fabricated by an ordinary semiconductor growth process.

The waveguide may include a cladding layer, a light guiding layer and an active layer constituting the active region, and the first semiconductor layer and the second semiconductor layer may be any ones of the cladding layer, the light guiding layer and the active layer, respectively.

Either the first semiconductor layer or the second semiconductor layer may be the active layer. The active layer necessarily has a certain degree of an optical confinement factor, and therefore, this design makes it easy to stabilize the cavity length or the effective refractive index of the waveguide against any temperature change. In this case, the other one of the first semiconductor layer and the second semiconductor layer may be preferably placed under and/or above the active layer in parallel with the active layer.

A first semiconductor layer having a positive refractive-index temperature coefficient may be the active layer. In this structure, crystal quality of the active layer can be readily provided, leading to improved characteristics of the laser. In this case, a second semiconductor layer having a negative refractive-index temperature coefficient is arranged near the active layer. Therefore, the structure can readily achieve both of the above-discussed functions.

The semiconductor layers formed on the substrate may include in the laser-light existing region the first semiconductor layer and the second semiconductor layer formed on an approximately common plane perpendicular to the growth direction and along a light propagation direction or cavity-axial direction. This relates to a structure wherein the compensation layer is disposed on a lateral side of the active region. In this case, a plurality of the first semiconductor layers and a plurality of the second semiconductor layers may be alternately formed on the common plane along the light propagation direction.

Also in the structure right above, one of the first semiconductor layer and the second semiconductor layer may be the active layer. In this structure, the other one of the first semiconductor layer and the second semiconductor layer may be formed on at least one of the lateral opposite sides of the active layer on the common plane along the light propagation direction. The first semiconductor layer having a positive refractive-index temperature coefficient may be the active layer. Technical advantages of such a structure are described above.

A combination of the above layer arrangements in the growth direction and in the lateral direction may be adopted. In such a structure, the effective refractive index of the waveguide can be stabilized in both the growth and lateral directions. Therefore, the lasing wavelength can be further stabilized and the fluctuation in the oscillation threshold current can be further suppressed.

A relation of $\beta=-(1-\Gamma)\alpha/\Gamma$ may be satisfied where $\alpha$ is the positive refractive-index temperature coefficient of the first semiconductor layer, $\beta$ is the negative refractive-index temperature coefficient of the second semiconductor layer, and $\Gamma$ is the optical confinement factor for the second semiconductor layer. This structure can further improve the stability of the oscillation wavelength.

The above structures may be adopted in a Fabry-Perot semiconductor laser, a distributed feedback semiconductor laser which includes a diffraction grating formed in the waveguide extending along the light propagation direction, or a distributed Bragg reflector semiconductor laser which includes a diffraction grating formed in a portion of the waveguide without the active region extending along the light propagation direction, which has a diffraction-grating region with the diffraction grating and an active-layer region with the active layer, and in which both the diffraction-grating region and the active-layer region include at least one semiconductor layer whose refractive-index temperature coefficient is negative, respectively.

The operation principle of the first configuration of the present invention is as follows.

Initially, the cavity length or the effective refractive index of the waveguide will be considered with respect to the stabilization of the oscillation wavelength. For simplicity, the refractive index of the semiconductor layers constituting the semiconductor laser is assumed to be n, and the compensation layer for compensating for a change in the refractive index is introduced. Layers with positive and negative temperature coefficients of refractive indices are those which mutually cancel out changes in their refractive indices, and one layer is accordingly named a compensation layer for the other layer. The effective refractive index $n_{eff}$ of the waveguide is given by:

$$n_{eff}=(1-\Gamma)n_s+\Gamma n \qquad (1),$$

where n is the refractive index of the compensation layer and $\Gamma$ is the optical confinement factor for the compensation layer which is determined by a ratio of a portion of a light intensity distribution involved in the compensation layer relative to the entire light intensity distribution. In the case of the Fabry-Perot LD, the optical length of the cavity can be obtained by a product of $n_{eff}$ and its physical cavity length. In the case of the DBR-LD, the optical length of its active-layer region can be obtained by a product of $n_{eff}$ and the physical length of the active-layer region.

Since the resonance wavelength is proportional to the effective refractive index or the cavity length, the oscillation wavelength is stabilized when the effective refractive index $n_{eff}$ is kept unchanged.

A condition therefor will be considered. Where $\alpha$ and $\beta$ are temperature coefficients of refractive indices of the semiconductor layers and the compensation layer, respectively, and $n_{s0}$ and $n_0$ are refractive indices of the semiconductor layers and the compensation layer at a reference temperature respectively, dependencies of refractive indices of the semiconductor layers and the compensation layer on a temperature change $\Delta T$ are represented as follows:

$$N_s = n_{s0} + \alpha \Delta T \quad (2),$$

and $$n = n_0 + \beta \Delta T \quad (3).$$

By substituting relation (1) into relations (2) and (3), the effective refractive index $n_{eff}$ of the waveguide is given by:

$$n_{eff} = [(1-\Gamma)n_{s0} + \Gamma n_0] + [(1-\Gamma)\alpha + \Gamma\beta]\Delta T \quad (4).$$

Since the first term on a right side in relation (4) is constant, the following condition is only required to maintain the effective refractive index $n_{eff}$ at a constant value and stabilize the oscillation wavelength of the laser:

$$\beta = -(1-\Gamma)\alpha/\Gamma \quad (5).$$

More moderately, the laser only needs to be designed such that $(1-\Gamma)\alpha + \Gamma\beta \approx 0$. The absolute value of the temperature coefficient $\alpha$ of semiconductor material used in the LD is ordinarily of the order of $10^{-4} K^{-1}$. The optical confinement factor $\Gamma$ only needs to be set at 0.5 if such material as satisfies $\beta = -\alpha$ exists, for example.

Next, the suppression effect of the fluctuation in the oscillation threshold current due to the semiconductor layer with a non-positive refractive-index temperature coefficient will be described.

The absorption coefficient $\alpha$ (E) of a semiconductor is approximately given for light having energy E above a bandgap $E_g$ by the following relation:

$$\alpha(E) \approx 2 \times 10^4 (E - E_g) cm^{-1} \quad (6),$$

where E and $E_g$ are expressed in units of an electron volts (eV).

From Kramers-Kronig relations, the refractive index n(E) is given by:

$$n(E) = 1 + c \cdot h/(2\pi^2) \cdot \int \alpha(E')/(E'^2 - E^2) \cdot dE'$$

(the integration range is from 0 to $\infty$)

$$= 1 + c \cdot h/(2\pi^2) \cdot \int \alpha(E')/(E'^2 - E^2) \cdot dE'$$

(the integration range is from $E_g$ to $\infty$)

$$= 1 + c \cdot h/(2\pi E) \cdot 10^4 (E + E_g)^{1/2} \quad (7)$$

(relation (6) is used)
where c is the velocity of light in vacuum and h is Planck's constant. Herein, the effect of band tailing is neglected since no substantial influence occurs to the consideration.

From relation (7), when $E = E_g$, $$n(E) = 1 + c \cdot h/(2\pi) \cdot 10^4 (2/E_g)^{1/2} \quad (8).$$

Therefore, when $E_g = 0.8$ eV (its corresponding wavelength $\lambda_g = 1.55$ $\mu$m) and both sides of relation (8) are differentiated with respect to temperature T, the following relation is obtained:

$$dn(E_g)/dT = -0.2 dE_g/dT \quad (9).$$

From relation (9), it is found that $dE_g/dT \geq 0$ in the material with a refractive-index temperature coefficient $dn/dT \leq 0$. Therefore, a band offset (a difference in energy gap between adjacent layers) at the surface of the layer having a non-positive refractive-index temperature coefficient increases as the temperature rises. Even when dn/dT=0 (zero refractive-index temperature coefficient), the band offset at the layer surface increases as the temperature rises if its adjacent layer has a positive refractive-index temperature coefficient (its energy gap decreases as the temperature rises). Hence, the overflow of carriers can be suppressed against an increase in temperature (i.e., carriers become difficult to overflow as the band offset is enlarged), and the fluctuation in the oscillation threshold current with the temperature change can be reduced.

When the second semiconductor layer with a negative temperature coefficient is the compensation layer placed in the laser-light existing region, there can be provided a semiconductor laser in which not only fluctuation in the oscillation wavelength but fluctuation in the oscillation threshold current are greatly lowered, i.e., which has an excellent temperature characteristic.

The operation principle is the same as above in a semiconductor laser wherein the semiconductor layers formed on the substrate include, in the laser-light existing region, the first semiconductor layer and the second semiconductor layer formed on the approximately common plane perpendicular to the growth direction and along the light propagation direction or cavity-axial direction. The laser light is also distributed in the direction perpendicular to the growth direction. Therefore, when the optical confinement factor in the direction perpendicular to the growth direction is considered, the above temperature-insensitive semiconductor laser which has an excellent temperature characteristic as well as the stabilized oscillation wavelength can be realized based on the same principle as discussed above.

In accordance with a second configuration of the present invention, there is provided a semiconductor laser wherein the waveguide includes a first region with at least one first semiconductor layer having a positive refractive-index temperature coefficient and a second region with at least one second semiconductor layer having a negative refractive-index temperature coefficient to achieve the function of approximately maintaining the optical length of the cavity or the effective refractive index of the waveguide at a constant value against a temperature change of the semiconductor laser, and wherein the first region and the second region are arranged serially along the light propagation direction.

More specifically, the following specific structures are possible in the second configuration.

The waveguide may include a first region and a second region to achieve the function of approximately maintaining the optical length of the cavity against a temperature change of the semiconductor laser. This specific structure is described in a seventh embodiment described below.

The waveguide may include a plurality of the first regions and a plurality of the second regions arranged alternately and serially along the light propagation direction to achieve the function of approximately maintaining the length of the cavity or the effective refractive index of the waveguide at a constant value against a change in temperature of the semiconductor laser. This specific structure is described below in an eighth embodiment.

The first semiconductor layer and the second semiconductor layer may be any layers constituting the semiconductor laser structure, respectively, so long as the optical length of the cavity or the effective refractive index of the waveguide is maintained constant against a temperature change. Therefore, the first semiconductor layer and the second semiconductor layer may be any one of a cladding layer, a light guiding layer, and an active layer constituting the active region, respectively.

Typically, one of the first semiconductor layer and the second semiconductor layer is the active layer. In this case, a first semiconductor layer having a positive refractive-index temperature coefficient is preferably the active layer since the crystal quality of a semiconductor with a negative refractive-index temperature coefficient is likely to be deteriorated.

The above structures may be adopted in a Fabry-Perot semiconductor laser, a distributed feedback semiconductor laser which includes a diffraction grating formed in the waveguide extending along the light propagation direction, or a distributed Bragg reflector semiconductor laser which includes a diffraction grating formed in a portion of the waveguide without the active region extending along the light propagation direction, which has a diffraction-grating region with the diffraction grating and an active-layer region with the active layer, and in which both the diffraction-grating region and the active-layer region or only the diffraction-grating region includes the first region and the second region arranged serially along the light propagation direction.

The operation principle of the second configuration of the present invention is as follows.

In the above structure, the resonance wavelength is proportional to the optical length of the cavity (in the case of the Fabry-Perot LD), or the effective refractive index of the waveguide (in the case of the DFB-LD). In the case of the DBR-LD, the resonance wavelength is concerned with the effective refractive index of the diffraction-grating region and the optical length of the active-layer region. A condition that the optical length $L_{eff}$ or the effective refractive index is maintained constant is required to stabilize the oscillation wavelength. The condition for a constant optical length $L_{eff}$ is treated in the following discussion, but conditions for a constant optical length and for a constant effective refractive index are equivalent to each other if the effective refractive index is substantially uniform over the entire cavity. As a representative example, a laser structure with serially coupled first and second regions having positive and negative refractive-index temperature coefficients, respectively, is adopted for consideration.

Where $n_p$ and $n_n$ are effective refractive indices of the first and second regions, respectively, $L_p$ and $L_n$ are physical lengths of the first and second regions, respectively, $\alpha$ and $\beta$ are temperature coefficients of refractive indices of the first and second regions, respectively, and $n_{p0}$ and $n_{n0}$ are refractive indices of the first and second regions at the reference temperature, respectively, dependencies of the refractive indices on a change in temperature $\Delta T$ in the first and second regions are given by:

$$n_p = n_{p0} + \alpha \Delta T \quad (10),$$

and $$n_n = n_{n0} + \beta \Delta T \quad (11).$$

When relations (10) and (11) are used, the condition for a constant optical length $L_{eff}$ of the optical cavity is given as follows:

$$L_{eff} = n_p L_p + n_n L_n = [n_{p0} L_p + n_{n0} L_n] + [\alpha L_p + \beta L_n] \Delta T \quad (12).$$

Since the first term on a right side of relation (12) is constant, the following condition is only required to maintain the optical length $L_{eff}$ of the optical cavity at a constant value:

$$\beta = -L_p/L_n \cdot \alpha \quad (13).$$

The absolute value of the temperature coefficient a of semiconductor material used in the LD is of the order of $10^{-4} K^{-1}$ in almost all cases. A relation of $L_p = L_n$ is only required if such material that satisfies $\beta = -\alpha$ exists, for example.

In the above description of the principle, no description is made to the active layer, but the gain spectrum slightly varies with the temperature change in a Fabry-Perot LD wherein the refractive-index temperature coefficient of the active layer is not zero. Therefore, its wavelength stability is a little poorer than that of the other types. When the active layer is formed of a semiconductor material whose refractive-index temperature coefficient is zero, that problem of poorer wavelength stability can be solved.

Further, the effective refractive index of the waveguide is not referred to in the above description of the principle of the second configuration, except special cases. Therefore, the wavelength stability cannot be sufficiently secured in DFB-LD and DBR-LD. However, the wavelength stability can also be obtained in those two LDs, when the first and second regions are alternately arranged as in the second embodiment later described and the effective refractive index is hence made substantially uniform over the entire waveguide, for example. In the DFB-LD, even where the optical length is made constant as discussed in the description of the principle, a certain degree of wavelength stability can be obtained if the diffraction grating is designed such that phases of light coincide with each other after one-round trip of the light. Furthermore, when the optical length is made constant in both the diffraction-grating region and the active-layer region of the DBR-LD, a certain degree of the wavelength stability can also be obtained. Even where the optical length is made constant only in the diffraction-grating region of the DBR-LD, a certain degree of the wavelength stability can be obtained if the diffraction grating is designed such that phases of light coincide with each other after one-round trip of the light.

In accordance with a third configuration of the present invention, there is provided a semiconductor laser wherein absolute values of refractive-index temperature coefficients of the semiconductor layers in the waveguide in a laser-light existing region are all set to be below $10^{-5} K^{-1}$ for a wavelength of laser light radiated in the active region. In this structure, the dependence of a change in the refractive index of the waveguide on a change in the temperature is made approximately equal to that of a dielectric light waveguide, for example. Therefore, light from the semiconductor laser can be smoothly guided into the dielectric light waveguide without any reflection when an integrated optical circuit is fabricated using those semiconductor laser and dielectric waveguide.

In this structure, where $n_s$ and $\Gamma_s$ are refractive index and optical confinement factor for each semiconductor layer constituting the semiconductor laser for the convenience of simplicity, respectively, the effective refractive index $n_{eff}$ of the waveguide in the laser-light existing region is approximately given by (the effectiveness of the following discussion is not lost by this assumption):

$$n_{eff} = \Sigma_s \Gamma_s n_s \quad (14)$$

($\Sigma_s$ means the summation with respect to s).

Here, when a refractive-index temperature coefficient $\alpha_s$ is introduced, then the dependence of the refractive index $n_s$ on a temperature change $\Delta T$ is represented by the following relation:

$$n_s = n_{s0} + \alpha_s \Delta T \quad (15).$$

Substituting relation (15) into relation (14), the effective refractive index $n_{\mathit{eff}}$ is given by:

$$n_{\mathit{eff}} = \Sigma_s \Gamma_s [n_{s0} + \alpha_s \Delta T] \quad (16).$$

In relation (16), since the first term in brackets is constant, the effective refractive index $n_{\mathit{eff}}$ is necessarily made constant in a region of $\Gamma_s \neq 0$ when the following relation is satisfied:

$$\alpha_s = 0 \quad (17).$$

In other words, the resonance wavelength is approximately maintained at a constant value against the temperature change when the refractive-index temperature coefficient is approximately zero in the semiconductor layer placed in the laser-light existing region (i.e., the semiconductor layer having a non-zero optical confinement factor).

The refractive index of a semiconductor layer placed in a region of $\Gamma_s = 0$ (i.e., a region where no laser light exists) does not contribute to the effective refractive index, and therefore, the refractive-index temperature coefficient of this semiconductor layer need not be zero.

Ideally, it is preferable that all refractive-index temperature coefficients $\alpha_s$ are all zero. However, though not zero, a fluctuation in the oscillation wavelength with the temperature change can be lowered when its value is small. The refractive-index temperature coefficient of semiconductor material of an ordinary semiconductor laser is as $\alpha_s \approx 10^{-4}$ $K^{-1}$, and the temperature coefficient of the dielectric light waveguide of glass or the like is about a tenth (1/10) thereof. Therefore, when the semiconductor laser using a semiconductor layer with $\alpha_s = 10^{-5} K^{-1}$ and the dielectric light waveguide are integrated to fabricate the optical circuit, both the laser and the dielectric waveguide exhibit approximately the same change in the refractive index such that light is smoothly propagated therebetween. Where the absolute value of $\alpha_s$ is further reduced, the fluctuation in the wavelength with the temperature change can be naturally further reduced.

More specifically, the following specific structures are possible in the third configuration.

Naturally, all the absolute values of the temperature coefficients may be set at zero for the wavelength of laser light radiated in the active region. In this case, it is found from the above relation (9) that $dE_g/dT = 0$ is established in the material with a zero refractive-index temperature coefficient ($dn_s/dT = 0$). As a result, the bandgap also can be approximately maintained at a constant value even when the temperature changes. Therefore, temperature-insensitive Fabry-Perot, DFB and DBR semiconductor lasers can be realized. Especially, the oscillation wavelength stability of the Fabry-Perot LD is prominent since its oscillation wavelength is influenced by both the energy band and the effective refractive index.

The cavity may include at least one semiconductor layer with a negative refractive-index temperature coefficient arranged in a region where no laser light exists. In this structure, fluctuations in both the oscillation wavelength and the oscillation threshold current can be greatly lowered.

The semiconductor layer with a negative refractive-index temperature coefficient may be placed in parallel with the active layer. In this case, the semiconductor layer with a negative refractive-index temperature coefficient may be placed under and/or above the active layer in parallel with the active layer.

The above structures may be adopted in a Fabry-Perot semiconductor laser, a distributed feedback semiconductor laser which includes a diffraction grating formed in the waveguide extending along the light propagation direction, or a distributed Bragg reflector semiconductor laser which includes a diffraction grating formed in a portion of the waveguide without the active region extending along the light propagation direction, which has a diffraction-grating region with the diffraction grating and an active-layer region with the active layer, and in which both the diffraction-grating region and the active-layer region include the above semiconductor-layer structures. The active-layer region may include a semiconductor layer with a negative refractive-index temperature coefficient.

These advantages and others will be more readily understood in connection with the following detailed description of the more preferred embodiments in conjunction with the drawings.

BRIEF DESCRIPTION OF THE DRAWINGS

FIG. 6A is a cross-sectional view taken along a cavity-axial direction illustrating a second embodiment of a temperature-insensitive semiconductor laser according to the present invention.

FIG. 6B is a cross-sectional view taken along a direction perpendicular to the cavity-axial direction illustrating the second embodiment.

FIG. 14A is a cross-sectional view taken along a cavity-axial direction illustrating a tenth embodiment of a temperature-insensitive semiconductor laser according to the present invention.

FIG. 14B is a cross-sectional view taken along a direction perpendicular to the cavity-axial direction illustrating the tenth embodiment.

DESCRIPTION OF THE PREFERRED EMBODIMENTS (First Embodiment)

Figure 1A:
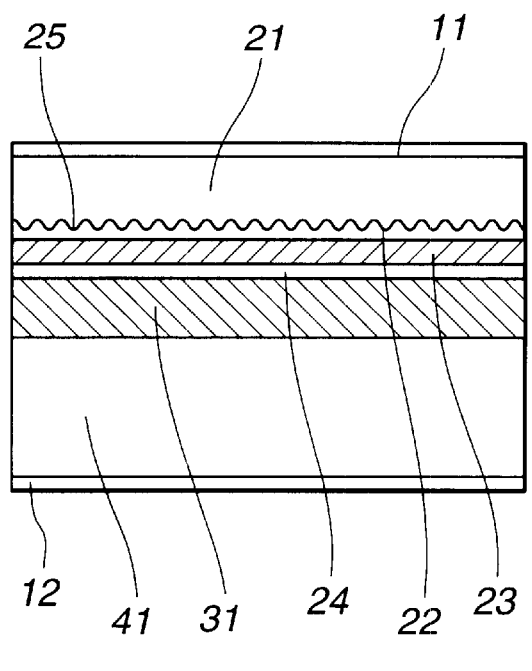
FIG. 1A is a cross-sectional view taken along a cavity-axial direction illustrating: a first embodiment of a semiconductor laser according to the present invention.
Figure 1B:
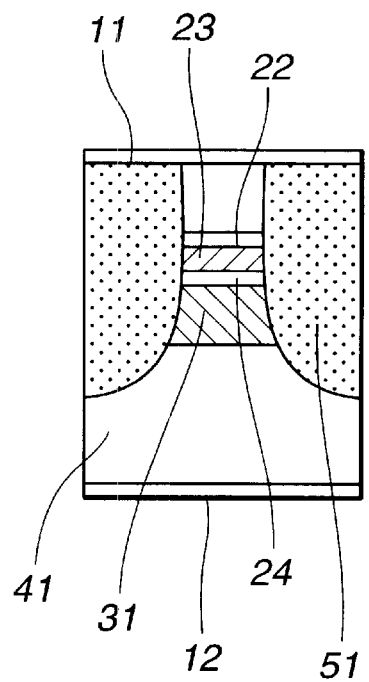
FIG. 1B is a cross-sectional view taken along a direction perpendicular to the cavity-axial direction illustrating the first embodiment.

FIGS. 1A and 1B illustrate a first embodiment of a temperature-insensitive DFB-LD. FIG. 1A shows a cross section of the device taken along a light propagation direction, while FIG. 1B shows that taken along a direction perpendicular to the light propagation direction. In the DFB-LD, a compensation layer 31, a lower light guiding layer 24, an active layer 23, an upper light guiding layer 22, and a cladding layer 21 are grown on a substrate 41. An anode 11 and a cathode 12 are formed on the cladding layer 21 and the bottom surface of the substrate 41, respectively. A diffraction grating 25 is formed at an interface between the upper light guiding layer 22 and the cladding layer 21. High-resistance layers 51 are formed on both lateral sides of the active layer 23 as illustrated in FIG. 1B.

The substrate 41 is composed of InP with a refractive index of 3.188 and has a thickness of 100 µm. The compensation layer 31 has a refractive index n and a thickness d. The lower and upper light guiding layers 22 and 24 are each composed of a 1.3 µm-composition InGaAsP with a refractive index of 3.35 and have a thickness of 0.1 µm. The active layer 23 is composed of a 1.55 µm-composition InGaAsP with a refractive index of 3.43 and has a thickness of 0.1 µm. The cladding layer 21 is composed of InP with a refractive index of 3.188 and has a thickness of 3 µm. The diffraction grating 25 is a first-order diffraction grating with a pitch $\Lambda$ of 2400 Å. Values of the above refractive indices are those measured at the temperature of 300 K. Temperature coefficients $\alpha$ and $\beta$ of refractive indices of the active layer 23 and the compensation layer 31 are $\alpha=-\beta=10^{-4}K^{-1}$, respectively.

As, discussed above, the active layer 23 has a positive refractive-index temperature coefficient while the compensation layer 31 has a negative refractive index temperature coefficient in the first embodiment. Thus, even if the temperature varies, the effective refractive index of the waveguide is stabilized and stability of the oscillation wavelength is hence achieved. In the DFB-LD, the oscillation wavelength is either one of wavelengths on opposite ends of its stop band when reflectivities at opposite facets of the device are negligibly small and no phase shift section is formed in the diffraction grating 25. The oscillation wavelength is the Bragg wavelength determined by the grating pitch and the effective refractive index when a phase shift section (e.g., a $\lambda/4$ shift section) is formed in the diffraction grating 25.

In the above structure, the DFB-LD is lased when a forward bias voltage is applied between the anode 11 and cathode 12 to cause a current flow above its oscillation threshold current. The high-resistance layer 51 is composed of Fe-doped InP and serves to prevent an undesired current from flowing through portions other than a light radiation portion.

Changing manners of characteristics of the laser depending on changes in thickness and refractive index at 300 K of the compensation layer 31 are described below.

Figure 2:
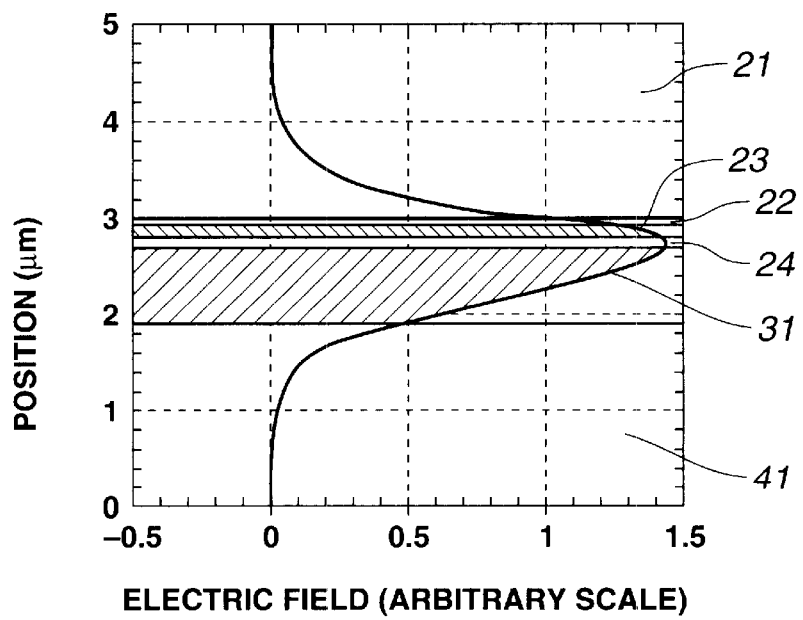
FIG. 2 is a graph illustrating an electric-field distribution of light in the first embodiment.

FIG. 2 illustrates an electric-field distribution of laser light of the device calculated by numerical analysis. The thickness and refractive index at 300 K of the compensation layer 31 are assumed to be d=0.8 µm and n=3.30, respectively. As material of the compensation layer 31 with a negative refractive-index temperature coefficient, there can be enumerated, for example, HgCdTe mixed crystal, HgCdSe mixed crystal, GaInAsBi mixed crystal, GaInPBi mixed crystal, GaAsPBi mixed crystal, GaInTlP mixed crystal, AlInTlAs mixed crystal, AlGaInTlPAs mixed crystal, GaInNAs mixed crystal and GaInNAsP mixed crystal (all of them have appropriate fraction moles, respectively). Any material with a negative refractive-index temperature coefficient can be used any rate. It is preferable that the compensation layer 31 is transparent to laser light radiated in the active layer 23. Therefore, the bandgap of the compensation layer 31 is preferably larger than the bandgap of the active layer 23. Alternatively, the compensation layer 31 may be composed of material that can act as a second active layer.

As can be seen from the above relation (1), it is preferable that the optical confinement factor $\Gamma$ for the compensation layer 31 is large, since the absolute value of the temperature coefficient $\beta$ can be smaller as the factor $\Gamma$ increases, and a variety of materials can be hence used for the compensation layer 31. To attain a low oscillation threshold current in the laser, it is important to keep the optical confinement factor $\Gamma_a$ for the active layer 23 as large as possible.

Figure 3:
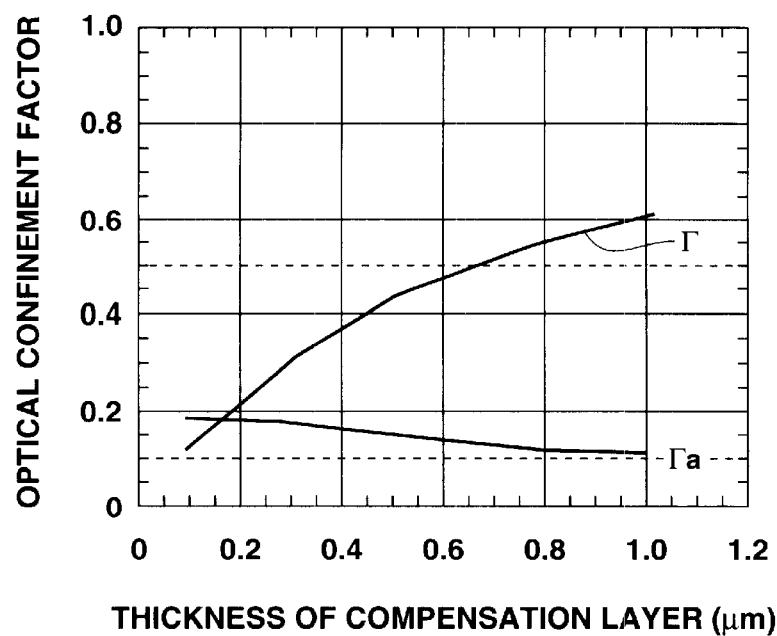
FIG. 3 is a graph illustrating dependencies of optical confinement factors of a compensation layer and an active layer on a thickness of the compensation layer in the first embodiment.

Turning to FIG. 3, this figure illustrates dependencies of the optical confinement factors $\Gamma$ and $\Gamma_a$ for the compensation layer 31 and the active layer 23 on the thickness d of the compensation layer 31 at the time when the refractive index n of the compensation layer 31 is n=3.30. As can be seen from FIG. 3, as the thickness d of the compensation layer 31 increases, the optical confinement factor $\Gamma_a$ for the active layer 23 gradually decreases while the optical confinement factor Γ for the compensation layer 31 increases. The optical confinement factor $\Gamma_a$ of about 0.1 or more is required to obtain a low oscillation threshold. It is found that this condition is kept up to d≦1 μm. The above values of n=3.30 and d=0.8 μm satisfy the condition. The optical confinement factor Γ for the compensation layer 31 is 0.5 when the compensation layer thickness is d=0.67 μm.

Here, the DFB-LD of a 1.55-μm band is considered. Hence, the pitch of the first-order diffraction grating 25 should be Λ=2400 Å. At this time, an oscillation-wavelength shift Δλ is given by:

$$\Delta\lambda = 2\Delta n_{eff}\Lambda \tag{18},$$

where $\Delta n_{eff}$ is a change in the effective refractive index with the temperature.

Figure 4A:
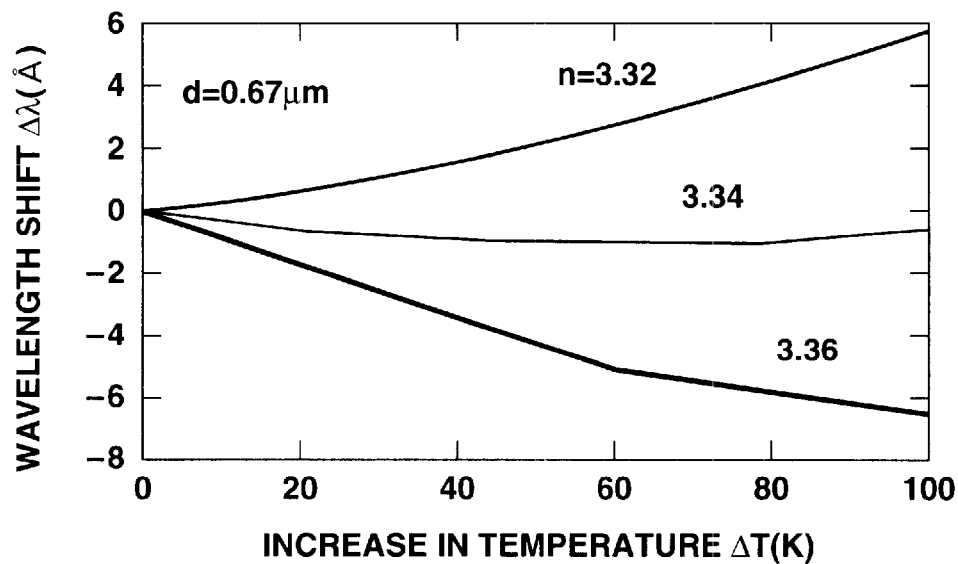
FIG. 4A is a graph illustrating the dependence of a wavelength shift on a change in temperature in the first embodiment, wherein the thickness of the compensation layer is constant and a parameter is a refractive index of the compensation layer at 300 K.
Figure 4B:
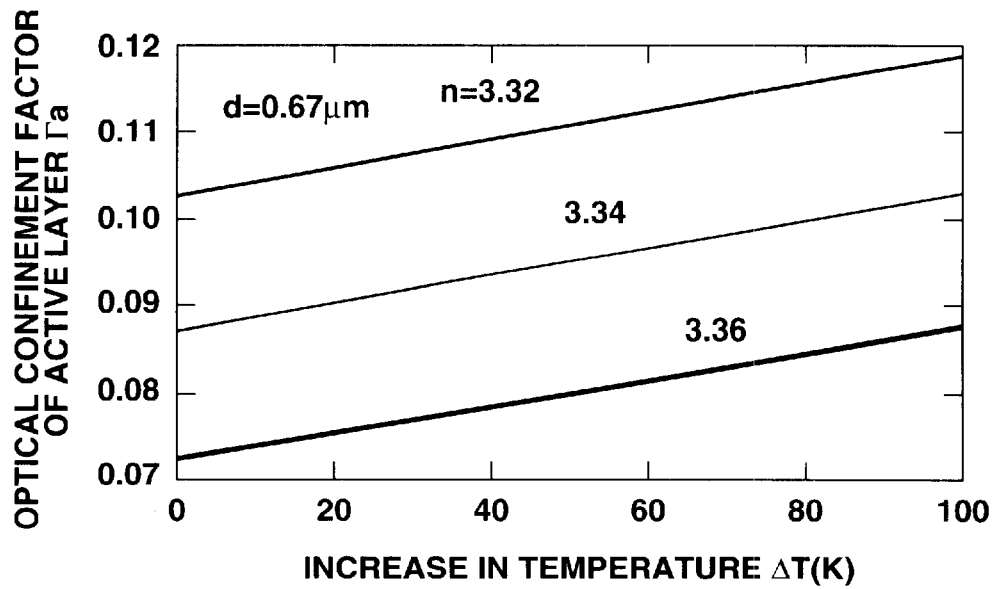
FIG. 4B is a graph illustrating the dependence of the optical confinement factor of the active layer on the change in temperature in the first embodiment, wherein the thickness of the compensation layer is constant and a parameter is the refractive index of the compensation layer at 300 K.

FIGS. 4A and 4B illustrate dependencies of the oscillation-wavelength shift Δλ and the optical confinement factor $\Gamma_n$ for the active layer 23 on the temperature, respectively, when the thickness d of the compensation layer 31 is 0.67 μm and a variable parameter is the refractive index n of the compensation layer 31 at 300 K. As shown in FIG. 4A, a change in the oscillation wavelength with the temperature is very small when n=3.34. The maximum wavelength shift in this case is −1.06 Å. Thus, the wavelength remains approximately unchanged at n=3.34 which is a little larger than the above-mentioned value of 3.30. The reason therefor is that the refractive index of the compensation layer 31 with a negative refractive-index temperature coefficient decreases and hence the optical confinement factor Γ also decreases as the temperature rises. When the light waveguide is designed with this decrease in the refractive index n in mind, a semiconductor laser with little wavelength change can be obtained. The oscillation wavelength shifts toward a longer wavelength side when n=3.32 (<3.34), because $\Delta n_{eff}/\Delta T > 0$ (here the influence of the positive refractive-index temperature coefficient of the active layer 23 is greater than that of the negative refractive-index temperature coefficient of the compensation layer 31). In contrast thereto, the oscillation wavelength shifts toward a shorter wavelength side when n=3.36 (>3.34), because $\Delta n_{eff}/\Delta T < 0$ (here the influence of the negative refractive-index temperature coefficient of the compensation layer 31 is greater than that of the positive refractive-index temperature coefficient of the active layer 23).

As shown in FIG. 4B, the optical confinement factor $\Gamma_a$ for the active layer 23 increases as the temperature rises, since the refractive index of the active layer 23 with a positive temperature coefficient increases and that of the compensation layer 31 decreases. In general, the oscillation threshold current increases due to the overflow of carries, Auger effect relevant to non-radiative recombination process, valence band absorption and the like, as the temperature goes up. The increase in $\Gamma_a$, however, effectively causes a decrease in the oscillation threshold current, and therefore, it is expected that the above structure can not only reduce the fluctuation in oscillation-wavelength but also enhance its characteristic temperature.

Further, as is apparent from FIG. 4B, $\Gamma_a$ is approximately equal to 0.1 when n=3.34, and therefore, the oscillation threshold current is expected to be sufficiently small. In the meantime, when the refractive index n of the compensation layer 31 is 3.32 (<3.34), $\Gamma_a$ increases since the peak of an electric-field distribution of light shifts toward the side of the active layer 23 more largely than in the case of n=3.34. On the other hand, when the refractive index n is 3.36 (>3.34), $\Gamma_a$ decreases since the peak of the electric-field distribution shifts toward the side of the compensation layer 31.

Figure 5A:
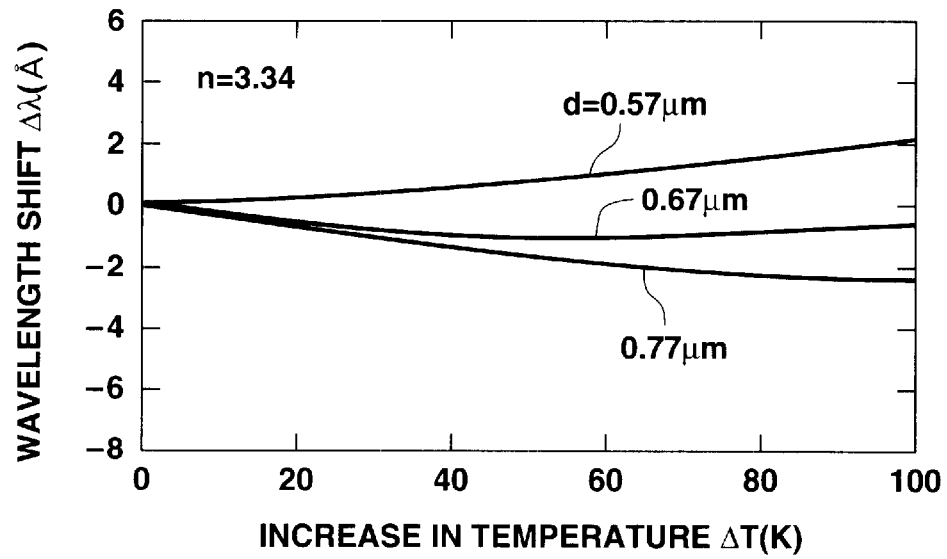
FIG. 5A is a graph illustrating the dependence of the wavelength shift on the change in temperature in the first embodiment wherein the refractive index of the compensation layer at 300 K is constant and a variable parameter is the thickness of the compensation layer.
Figure 5B:
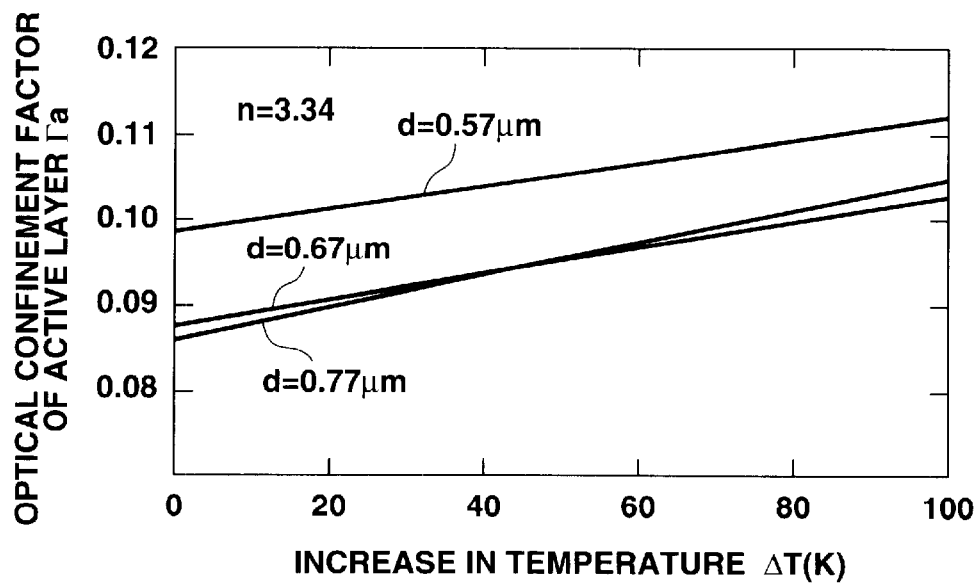
FIG. 5B is a graph illustrating the dependence of the optical confinement factor of the active layer on the change in temperature in the first embodiment, wherein the refractive index of the compensation layer at 300 K is constant and a variable parameter is the thickness of the compensation layer.

FIGS. 5A and 5B illustrate dependencies of the oscillation-wavelength shift Δλ and the optical confinement factor $\Gamma_a$ for the active layer 23 on the temperature, which appear when the refractive index n of the compensation layer 31 is fixed at 3.34 and the thickness d of the compensation layer 31 is used as a variable parameter. The oscillation-wavelength shift Δλ will be considered first. As is illustrated in FIG. 5A, the optical confinement within the compensation layer 31 is small when the thickness d=0.57 μm (<0.67 μm), so that the influence of the compensation layer 31 with a negative temperature coefficient is small and the oscillation wavelength hence shifts to a longer wavelength side. In contrast thereto, the optical confinement within the compensation layer 31 is too large when the thickness d=0.77 μm (>0.67 μm), so that the effect of a decrease in the refractive index of the compensation layer 31 is dominant and the oscillation wavelength hence shifts to a shorter wavelength side.

FIG. 5B illustrates the dependence of the optical confinement factor $\Gamma_a$ for the active layer 23 on the temperature. As illustrated also in FIG. 2, the intensity of light is weak near the substrate 41, so that little effect exists when the thickness of the compensation layer 31 is increased above a certain value. Therefore, as illustrated in FIG. 3, the increase in the optical confinement factor $\Gamma_a$ for the active layer 23 saturates with increasing thickness d of the compensation layer 31. As a result, the dependence of $\Gamma_a$ on the temperature is almost similar between cases of d=0.67 μm and d=0.77 μm.

In the structure of this embodiment, the thickness and the refractive index at 300 K of the compensation layer 31 are designed in accordance with a need, considering the above matter.

Meanwhile, when the compensation layer 31 is composed of material with a negative refractive-index temperature coefficient (dn/dT<0), it is found from the above relation (9) that $dE_g/dT > 0$ for such material. Therefore, a band offset at the surface of the compensation layer 31 increases as the temperature rises. Thus, the overflow of carriers can be suppressed. The characteristic temperature, which is an index of a change in the oscillation threshold current with the temperature, is thus 150 K, and a laser with an excellent temperature characteristic can be achieved. As described in the foregoing, both fluctuations in the oscillation wavelength and the oscillation threshold current are small in the semiconductor laser of the first embodiment.

In the first embodiment, a buried-channel structure is used as a waveguide structure as illustrated in FIG. 1B, but a ridge waveguide or rib waveguide may also be used. Further, the light waveguide may lack the light guiding layer. In the case of a semiconductor laser with the diffraction grating, the grating can be formed on either the light guiding layer or the substrate. The above-discussed effect of this embodiment can be expected in the distributed Bragg reflector laser diode (DBR-LD) as well as the DFB-LD discussed above. In the case of the DBR-LD, both its diffraction-grating (distributed reflector) region and active-layer region include the above-described layer structures, respectively, in which layers with positive and negative refractive-index temperature coefficients are formed nearby.

Even in the Fabry-Perot LD without diffraction gratings, when the LD includes such a layer structure in which layers with positive and negative refractive-index temperature coefficients are formed nearby, its optical cavity length can be approximately kept unchanged. Hence, fluctuations in its resonance wavelength and its oscillation threshold with the temperature can be reduced. In the case of the Fabry-Perot LD, however, the oscillation wavelength is also influenced by a change in its gain spectral profile (in the above structure, the gain spectral profile of the active layer with a positive refractive-index temperature coefficient somewhat changes as the temperature changes). Therefore, the wavelength stability of the Fabry-Perot LD is a little poorer than those of DFB-LD and DBR-LD.

In this embodiment, the compensation layer 31 is formed on the substrate 41, but it may be formed in any location where the electric field of laser light is distributed. The compensation layer 31 can also be used as light guiding layer, active layer or cladding layer, provided that another layer with a positive refractive-index temperature coefficient is formed nearby. Further, the number of compensation layers may be either single or plural. Where the problem of dislocation due to a strain may occur as the thickness of the compensation layer increases, it is preferable to reduce the thickness of the compensation layer and provide a plurality of compensation layers. In this embodiment, materials of InGaAsP series are used, but any semiconductor material can be employed likewise.

In this embodiment, the active layer is formed of material having a positive refractive-index temperature coefficient and the compensation layer is formed of material having a negative refractive-index temperature coefficient, but this combination can be reversed. However, it is not preferable to form the active layer of the material with a negative refractive-index temperature coefficient, since crystal quality of such material generally is not so good. Further, that reversed combination is not preferable in the light of the effect of suppression of the carrier overflow against the rise in temperature and the increase in the optical confinement factor for the active layer. Its stability of the oscillation threshold current is poorer than the structure of the above-discussed first embodiment.

(Second Embodiment)

FIGS. 6A and 6B illustrate a second embodiment of a temperature-insensitive LD. In the LD, lower and upper compensation layers 131a and 131b having negative refractive-index temperature coefficients are formed sandwiching an active layer 123. This structure can be regarded as either a DFB-LD (in this case, a diffraction grating is not shown in FIGS. 6A and 6B) or a Fabry-Perot LD. In the case where this structure is applied to a DBR-LD, both its diffraction-grating region (the active layer is replaced by a light guiding layer therein) and active-layer region have layer structures as illustrated in FIGS. 6A and 6B, respectively.

In FIGS. 6A and 6B, reference numeral 111 and 112 denote anode and cathode, respectively, reference numeral 121 denotes a cladding layer, reference numerals 122 and 124 are upper and lower light guiding layers, respectively, reference numeral 141 denotes a substrate, and a reference numeral 151 denotes a high-resistance layer.

In the structure of the second embodiment, since the compensation layers 131a and 131b with negative refractive-index temperature coefficients exist above and below the active layer 123, energy barriers for both electrons and holes are enhanced as the temperature rises. Therefore, the overflow of carriers can be further reduced in this embodiment, compared with the first embodiment. As a result, the fluctuation in the oscillation threshold current can be lowered in the second embodiment more effectively than in the first embodiment. The characteristic temperature of the second embodiment can be raised up to 250 K, while that of the first embodiment is 150 K. Thus, a laser with an excellent temperature characteristic can be realized in the second embodiment. In the second embodiment, the number of the compensation layers may be three or more. With regard to other points, the second embodiment is substantially the same as the first embodiment.

(Third Embodiment)

Figure 7:
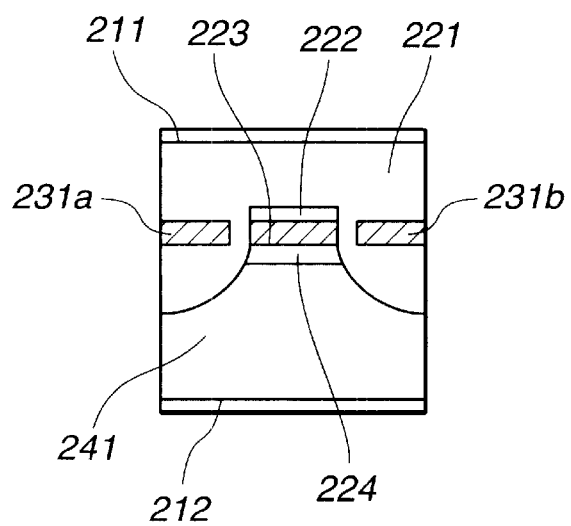
FIG. 7 is a cross-sectional view taken along a direction perpendicular to the cavity-axial direction illustrating a third embodiment of a temperature-insensitive semiconductor laser according to the present invention.

FIG. 7 illustrates a third embodiment of a temperature-insensitive LD. FIG. 7 shows a cross section perpendicular to a light propagation direction. In the LD of the third embodiment, right and left compensation layers 231a and 231b are formed on both lateral sides of an active layer 223. Similarly to the description in the second embodiment, this structure can be regarded as either DFB-LD or Fabry-Perot LD. Further, this structure is also applicable to a DBR-LD in the same manner as described in the second embodiment.

In FIG. 7, reference numerals 211 and 212 denote anode and cathode, respectively, reference numeral 221 denotes a cladding layer, reference numerals 222 and 224 denote upper and lower light guiding layers, respectively, and reference numeral 241 denotes a substrate.

In this structure, laser light is distributed also along a direction perpendicular to a growth direction of semiconductor layers, and the compensation layers 231a and 231b are placed in those light-distributed lateral regions. Thus, the same effect as that of the second embodiment is obtained in the third embodiment. In the third embodiment since the compensation layers 231a and 231b are not laid down above/below the active layer 223 in the growth direction, crystal quality of the active layer 223 can be secured without adverse influence from the compensation layers 231a and 231b even when the crystal quality of the layers 231a and 231b is not so good.

The third embodiment can be fabricated as follows, for example. After semiconductor layers up to the upper light guiding layer 222 are laid down over the substrate 241, lateral portions of the wafer are etched away as illustrated in FIG. 7 and the cladding layer 221 is formed up to a level of the active layer 223. Then, the compensation layers 231a and 231b are selectively grown on respective lateral sides of the active layer 223 using a mask. Here, there is formed a spacing between the active layer 223 and each compensation layer 231a/231b due to the fabrication method as illustrated in FIG. 7, but the spacing is not necessarily required from a functional viewpoint. The cladding layer 221 then is formed further, as illustrated in FIG. 7.

Also in the third embodiment, a buried-channel structure is used as a waveguide structure, but a ridge waveguide or rib waveguide can be used. Further, levels of the compensation layers 231a and 231b and the active layer 223 are approximately the same in FIG. 7, but those levels may be slightly differentiated so long as the compensation layers 231a and 231b are placed on the lateral side of the active layer 223.

The principle of the oscillation wavelength stabilization in the third embodiment is substantially the same as in the first embodiment.

(Fourth Embodiment)

Figure 8:
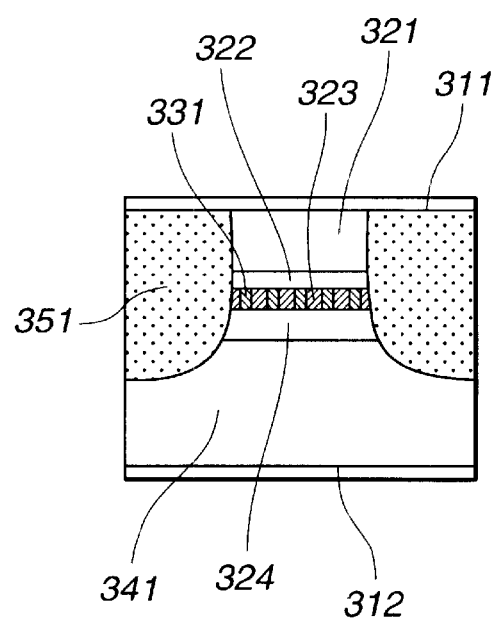
FIG. 8 is a cross-sectional view taken along a direction perpendicular to the cavity-axial direction illustrating a fourth embodiment of a temperature-insensitive semiconductor laser according to the present invention.

FIG. 8 illustrates a fourth embodiment of a temperature-insensitive LD. FIG. 8 shows a cross section perpendicular to a light propagation direction. In the LD of the fourth embodiment, a combined layer of compensation layers (strips) 331 and active layers (strips) 323 extends in a light propagation direction with the layers (strips) arranged in a parallel manner and alternately placed along a lateral direction, as illustrated in FIG. 8. Similarly to the description in the second embodiment, this structure can be regarded as either a DFB-LD or a Fabry-Perot LD. Further, this structure is also applicable to a DBR-LD in the same manner as described in the second embodiment.

In FIG. 8, reference numeral 311 and 312 denote anode and cathode, respectively, reference numeral 321 denotes a cladding layer, reference numerals 322 and 324 denote upper and lower light guiding layers, respectively, reference numeral 341 denotes a substrate, and reference numeral 351 denotes a high-resistance layer.

The principle of the oscillation wavelength stabilization in the fourth embodiment is also substantially the same as in the first embodiment. Though the process of fabricating the above alternating layer of active and compensation layers (strips) is a little complicated, optical confinement factors for the compensation layers (strips) 331 and the active layers (strips) 323 can readily be made approximately equal in the structure of the fourth embodiment.

The configuration of the alternating-layer (strip) arrangement can be various about thicknesses, widths, growth levels, periodicities and so forth of the compensation layers (strips) 331 and the active layers (strips) 323. In any rate, this configuration only needs to be formed such that the cavity length or the effective refractive index of the waveguide can remain approximately unchanged in spite of the temperature change.

However, the effect of suppression of the carrier overflow against the temperature rise cannot be largely expected in the fourth embodiment, compared to the first embodiment. Regarding other points, the fourth embodiment is likewise substantially the same as the first embodiment.

(Fifth Embodiment)

Figure 9:
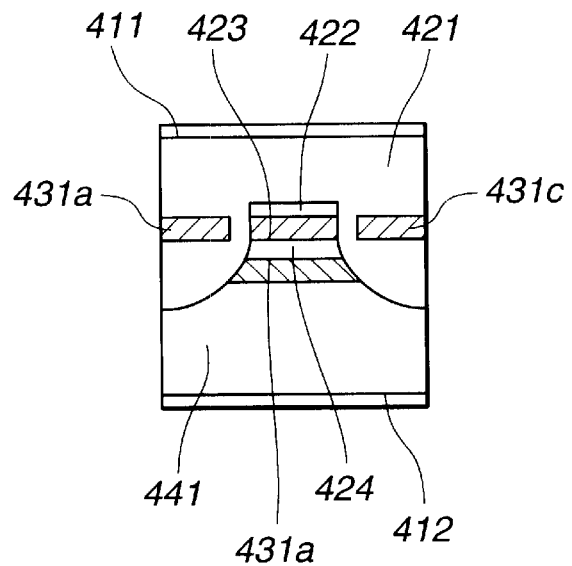
FIG. 9 is a cross-sectional view taken along a direction perpendicular to the cavity-axial direction illustrating a fifth embodiment of a temperature-insensitive semiconductor laser according to the present invention.

FIG. 9 illustrates a fifth embodiment of a temperature-insensitive LD. FIG. 9 shows a cross section perpendicular to a light propagation direction. In the LD of the fifth embodiment, compensation layers 431a, 431b and 431c are formed below and on both lateral sides of an active layer 423. In this structure, the wavelength fluctuation is further reduced, the oscillation threshold current is further lowered, and the temperature characteristic is further improved, compared with the first embodiment. Regarding other points, the fifth embodiment is substantially the same as the first and third embodiments.

In FIG. 9, reference numeral 411 and 412 denote anode and cathode, respectively, reference numeral 421 denotes a cladding layer, reference numerals 422 and 424 denote upper and lower light guiding layers, respectively, and reference numeral 441 denotes a substrate.

(Sixth Embodiment)

Figure 10:
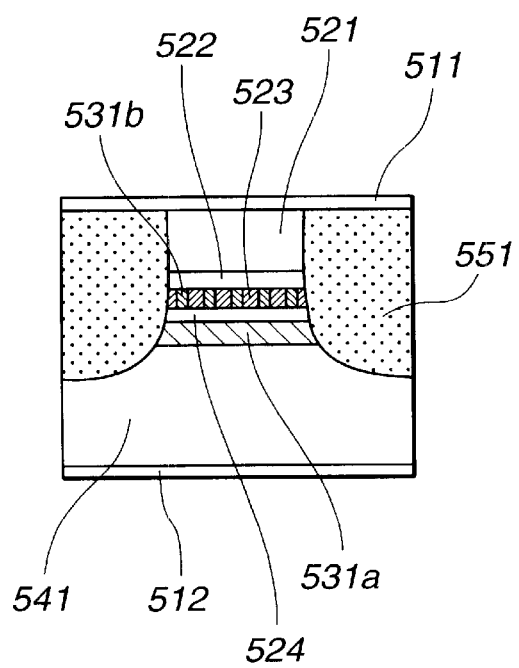
FIG. 10 is a cross-sectional view taken along a direction perpendicular to the cavity-axial direction illustrating a sixth embodiment of a temperature-insensitive semiconductor laser according to the present invention.

FIG. 10 illustrates a sixth embodiment of a temperature-insensitive LD. FIG. 10 shows a cross section perpendicular to a light propagation direction. In the LD of the sixth embodiment, the structure of the first embodiment is combined with the structure of the fourth embodiment.

In FIG. 10, reference numeral 511 and 512 denote anode and cathode, respectively, reference numeral 521 denotes a cladding layer, reference numerals 522 and 524 denote upper and lower light guiding, layers, respectively, reference numeral 523 denotes an active layer (strip), reference numerals 531a denotes a lower compensation layer and 531b denotes a compensation layer (strip), respectively, reference numeral 541 denotes a substrate, and reference numeral 551 denotes a high-resistance layer.

The principle of operation and technical advantages of this embodiment are the same as those of the first embodiment and the fourth embodiment.

(Seventh Embodiment)

Figure 11:
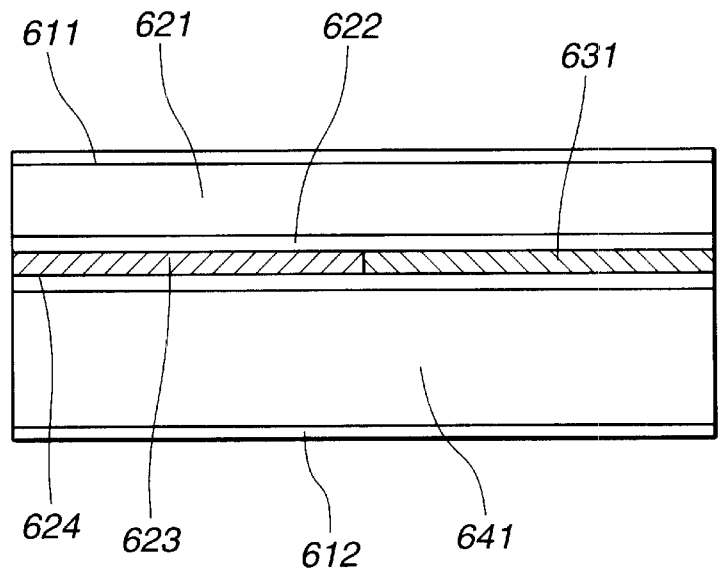
FIG. 11 is a cross-sectional view taken along a cavity-axial direction illustrating a seventh embodiment of a temperature-insensitive semiconductor laser according to the present invention.

FIG. 11 illustrates a seventh embodiment of a temperature-insensitive Fabry-Perot LD. FIG. 11 shows a cross section of the device taken along a light propagation direction. In this LD, a lower light guiding layer 624, an active layer 623 and a compensation layer 631 which are serially formed in the light propagation direction, an upper light guiding layer 622, and a cladding layer 621 are deposited on a substrate 641. An anode 611 and a cathode 612 are formed on the cladding layer 621 and the bottom surface of the substrate 641, respectively.

The substrate 641 is composed of InP and has a thickness of 100 $\mu$m. The compensation layer 631 has a thickness of 0.1 $\mu$m. The lower and upper light guiding layers 622 and 624 are composed of a 1.3 $\mu$m-composition InGaAsP and have thicknesses of 0.1 $\mu$m. The active layer 623 is composed of a 1.55 $\mu$m-composition InGaAsP and has a thickness of 0.1 $\mu$m. The cladding layer 621 is composed of InP and has a thickness of 3 $\mu$m. The active layer 623 has a positive refractive-index temperature coefficient $\alpha$ of $10^{-4}K^{-1}$, while the compensation layer 631 has a negative refractive-index temperature coefficient $\beta$ of $-10^{-4}K^{-1}$. Materials having a negative refractive-index temperature coefficient are enumerated in the description of the first embodiment. The compensation layer 631 can be formed such that it also can act as an active layer.

In the above structure, the LD is lased when a forward bias voltage is applied between the anode 611 and cathode 612 to cause a current flow above the oscillation threshold of the laser. The oscillation wavelength is determined by a gain spectrum of the active layer 623 and an optical length of the cavity. As can be seen from the above relation (14), when physical lengths of the active layer 623 and the compensation layer 631 are made equal in the case of $\alpha=-\beta$, the optical length of the cavity is maintained at a constant value in spite of the temperature change. Therefore, the fluctuation in the oscillation wavelength with the temperature can be approximately eliminated. Actually, since the semiconductor crystal thermally expands as the temperature rises, a change in the oscillation wavelength inevitably amounts to 0.1 Å when the temperature changes 100 K.

In this embodiment, the compensation layer and the active layer are not formed in the growth direction. Hence, the active layer 623 is not adversely influenced by the compensation layer 631 even if crystal of the compensation layer 631 is not so good.

In this embodiment, any structure, such as a buried-channel structure, a ridge waveguide or a rib waveguide, can be used as a transverse-mode control structure or waveguide structure. Further, the light waveguide may lack the light guiding layer.

The structure of this embodiment can be applied to the DFB-LD and the DBR-LD each of which includes a light waveguide and a diffraction grating. In the case of the DFB-LD, the diffraction grating is preferably designed such that phases of light coincide with each other after one-round trip of the light. For example, pitches of the diffraction grating are appropriately made different between active-layer region and compensation-layer region.

In the case of the DBR-LD, a light guiding layer in a diffraction-grating region is formed of a serial arrangement of guiding layers having positive and negative refractive-index temperature coefficients, and an active layer in an active-layer region is formed of a serial arrangement of layers (both may be active layers, or either one may be an active layer) having positive and negative refractive-index temperature coefficients, for example. Alternatively, the active layer may be formed of a single active layer. In the former case the pitch of the grating may be uniform, while in the latter case pitches of the diffraction gratings in guiding-layer regions (having positive and negative refractive-index temperature coefficients) need to be appropriately differentiated such that phases of light coincide with each other after one-round trip of the light.

Further, though the compensation layer 631 is disposed at the same level in the growth direction as that of the active layer 623 in the seventh embodiment, the level of the compensation layer 631 may be changed and it may be formed as the light guiding layer or cladding layer. It is preferable that the bandgap of the compensation layer 631 is larger than that of the active layer 623 such that the compensation layer 631 is transparent to laser light radiated in the active layer 623.

Further, the number of compensation layers may be either single or plural. Where the problem of dislocation due to a strain may occur as the thickness of the compensation layer increases, it is preferable to reduce the thickness of the compensation layer and provide a plurality of compensation layers. In this embodiment, materials of InGaAsP series are used, but any semiconductor material can be employed similarly to the above embodiments.

(Eighth Embodiment)

Figure 12:
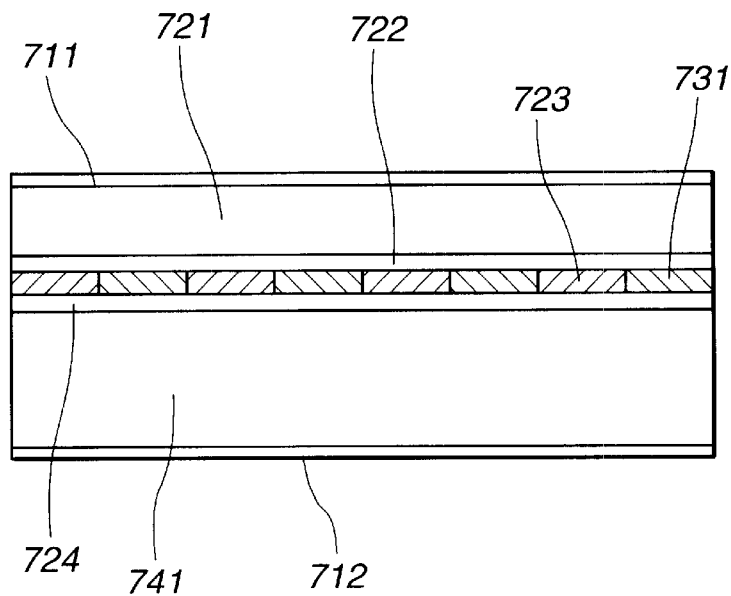
FIG. 12 is a cross-sectional view taken along a cavity-axial direction illustrating an eighth embodiment of a temperature-insensitive semiconductor laser according to the present invention.

FIG. 12 illustrates an eighth embodiment of a temperature-insensitive Fabry-Perot LD. In the LD, compensation layers (strips) 731 and active layers (strips) 723 are alternately arranged along a light propagation direction or cavity-axial direction. The same effect as that of the seventh embodiment can be obtained. in the eighth embodiment when the device is designed such that the optical length of the cavity is maintained at a constant value in spite of the temperature change.

In FIG. 12, reference numerals 711 and 712 denote anode and cathode, respectively, reference numeral 721 denotes a cladding layer, reference numerals 722 and 724 denote upper and lower light guiding layers, respectively, and reference numeral 741 denotes a substrate.

The structure of this embodiment also can be applied to the DFB-LD and the DBR-LD each of which includes a light waveguide and a diffraction grating. In the case of the DBR-LD, a diffraction-grating region is formed of the above alternate arrangement of layers (strips) having positive and negative refractive-index temperature coefficients, and an active-layer region is formed of the above alternating arrangement of layers (strips) having positive and negative refractive-index temperature coefficients, or such a structure with a constant optical length as described in the seventh embodiment. In those cases, when the effective refractive index over the entire waveguide with the above-discussed alternating arrangement is substantially kept unchanged in spite of the temperature change, the pitch of the grating also can be made uniform.

The configuration of the above alternating arrangement can vary with respect to the thicknesses, lengths in the light propagation direction, growth levels, periodicities and so forth of the compensation layers (strips) 731 and the active layers (strips) 723. At any rate, this configuration only needs to be formed such that the cavity length or the effective refractive index of the waveguide can remain approximately unchanged in spite of the temperature change.

In the seventh and eighth embodiments, a layer having a negative refractive-index temperature coefficient may be additionally formed in parallel with the active layer at a place where no propagating light exists, such that the overflow of carriers can be reduced even when the temperature rises and the stability of the oscillation threshold current can be improved (i.e., improvement of the characteristic temperature).

In this case, advantageous effects of those embodiments will not be adversely affected since the refractive index of the semiconductor layer placed in the light-absent region cannot contribute to the cavity length or the effective refractive index of the waveguide.

(Ninth Embodiment)

Figure 13A:
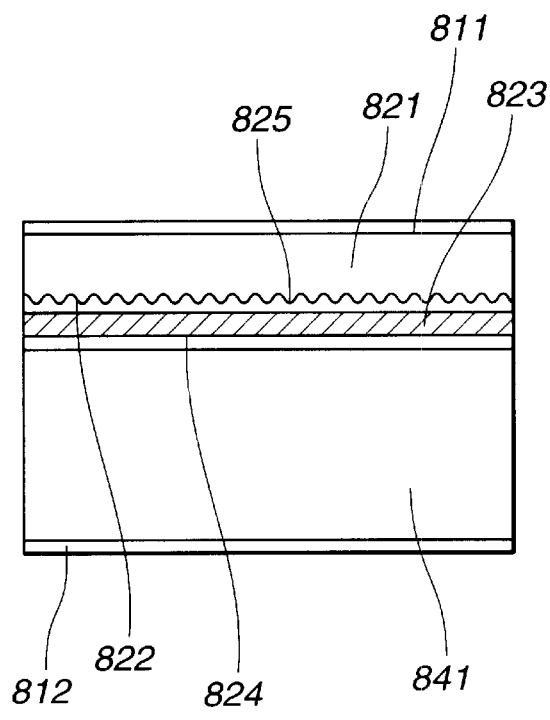
FIG. 13A is a cross-sectional view taken along a cavity-axial direction illustrating a ninth embodiment of a temperature-insensitive semiconductor laser according to the present invention.
Figure 13B:
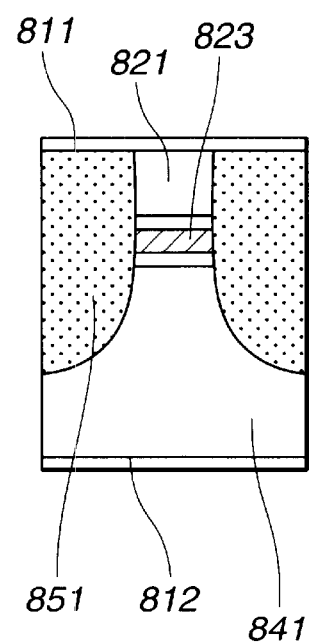
FIG. 13B is a cross-sectional view taken along a direction perpendicular to the cavity-axial direction illustrating the ninth embodiment.

FIGS. 13A and 13B illustrate a ninth embodiment of a temperature-insensitive DFB-LD. FIG. 13A shows a cross section of the device taken along a light propagation direction, while FIG. 13B shows that taken along a direction perpendicular to the light propagation direction. In the DFB-LD, a lower light guiding layer 824, an active layer 823, an upper light guiding layer 822 and a cladding layer 821 are formed on a substrate 841. An anode 811 and a cathode 812 are formed on the cladding layer 821 and the bottom surface of the substrate 841, respectively. A diffraction grating 825 is formed at an interface between the upper light guiding layer 822 and cladding layer 821. High-resistance layers 851 are formed on both lateral sides of the active layer 823 as illustrated in FIG. 13B.

The substrate 841 is composed of InNP and has a thickness of 100 $\mu$m. The lower and upper light guiding layers 822 and 824 are composed of a 1.3 $\mu$m-composition InGaAsNP and have a thickness of 0.1 $\mu$m, respectively. The active layer 823 is composed of a 1.55 $\mu$m-composition InGaAsNP and has a thickness of 0.1 $\mu$m. The cladding layer 821 is composed of InNP and has a thickness of 3 $\mu$m. The grating 825 is a first-order diffraction grating with a pitch Λ of 2400 Å. All the refractive-index temperature coefficients of the above semiconductor materials are set at zero (0). Specifically, fraction moles of those semiconductor materials are adjusted so as to obtain the temperature coefficient of zero.

In the above structure, the DFB-LD is lased when a forward bias voltage is applied between the anode 811 and cathode 812 to cause a current flow above the oscillation threshold of the laser. The oscillation wavelength is either one of wavelengths on opposite ends of its stop band when reflections at opposite facets of the device are negligible and no phase shift section is formed in the diffraction grating 825. The oscillation wavelength is the Bragg wavelength determined by the grating pitch and the effective refractive index when a phase shift section (e.g., a λ/4 shift section) is formed in the diffraction grating 825.

The high-resistance layer 851 is composed of Fe-doped InNP and acts to prevent an undesired current from flowing through portions other than the light radiation portion. Propagating light also extends to the high-resistance layer 851 slightly, and therefore, the refractive-index temperature coefficient of this layer 851 is also set at zero.

In the ninth embodiment, a change in the oscillation wavelength is less than 0.1 Å when the temperature is raised from room temperature up to 100° C. This value is sufficiently smaller than a wavelength change of about 80 Å in a conventional semiconductor laser. Here, the wavelength change of this embodiment is not completely reduced to zero because of thermal expansion of the semiconductor materials.

Where materials or fraction moles of the semiconductor layers are modified such that their refractive-index temperature coefficients are made equal to $10^{-5}K^{-1}$, the wavelength change is approximately 8 Å when the temperature is changed over the same range. Such a degree of wavelength stability is sufficient to fabricate an optical integrated circuit of dielectric light waveguide and semiconductor laser.

Also in the ninth embodiment, a buried-channel structure is used as a waveguide structure as illustrated in FIG. 13B, but a ridge waveguide or rib waveguide may be used. Further, the light waveguide may be provided without a light guiding layer. In the case of a semiconductor laser with the diffraction grating, the grating can be formed on either the light guiding layer or the substrate.

The above-discussed effect of this embodiment can be expected in the DBR-LD as well as the DFB-LD. In the case of the DBR-LD, both its diffraction-grating (distributed reflector) region and its active-layer region respectively include the above-described layer structures in which layers with absolute values of refractive-index temperature coefficients below $10^{-5}K^{-1}$ are formed. Even in the Fabry-Perot LD without diffraction gratings, the same effect can be expected.

As semiconductor material of the above refractive-index temperature coefficient below $10^{-5}K^{-1}$, there exist other than InGaAsNP series, for example, HgCdTe mixed crystal, HgCdSe mixed crystal, GaInAsBi mixed crystal, GaInPBi mixed crystal, GaAsPBi mixed crystal, GaInTlP mixed crystal, AlInTlAs mixed crystal, AlGaInTlPAs mixed crystal, GaInNAs mixed crystal and GaInNAsP mixed crystal (all of them have appropriate fraction moles, respectively). Any material with a nearly-zero refractive-index temperature coefficient can be used.

(Tenth Embodiment)

FIGS. 14A and 14B illustrate a tenth embodiment of a temperature-insensitive DFB-LD. In the DFB-LD, an additional semiconductor layer 931 with a negative refractive-index temperature coefficient is laid down over a substrate 941.

In FIGS. 14A and 14B, reference numerals 911 and 912 denote anode and cathode, respectively, reference numeral 921 denotes a cladding layer, reference numerals 922 and 924 denote upper and lower light guiding layers, respectively, reference numeral 923 denotes an active layer, reference numeral 925 denotes a diffraction grating, and reference numeral 951 denotes a high-resistance layer. Such layers transmitting the propagating light have nearly-zero refractive-index temperature coefficients.

In the structure of the tenth embodiment, the thickness of the lower light guiding layer 924 is set to 1 μm such that no laser light extends to the semiconductor layer 931. As the temperature rises, the bandgap of the semiconductor layer 931 is enlarged, and hence, an energy barrier for carriers is enhanced. Therefore, the overflow of carriers can be reduced in this embodiment. As a result, fluctuation in the oscillation threshold current can be lowered in the tenth embodiment more effectively than in the ninth embodiment. The characteristic temperature of the tenth embodiment can be raised up to 150 K, while that of the ninth embodiment is 100 K. Thus, a laser with an excellent temperature characteristic can be realized in the tenth embodiment. The semiconductor layer 931 may be formed above the active layer 923. At any rate, the semiconductor layer 931 with a negative refractive-index temperature coefficient only needs to be placed around the active layer 923.

Examples of semiconductor materials with a negative refractive-index temperature coefficient are enumerated in the description of the first embodiment. The above structure of this embodiment also can be applied to the DBR-LD and the Fabry-Perot LD.

(Eleventh Embodiment)

Figure 15A:
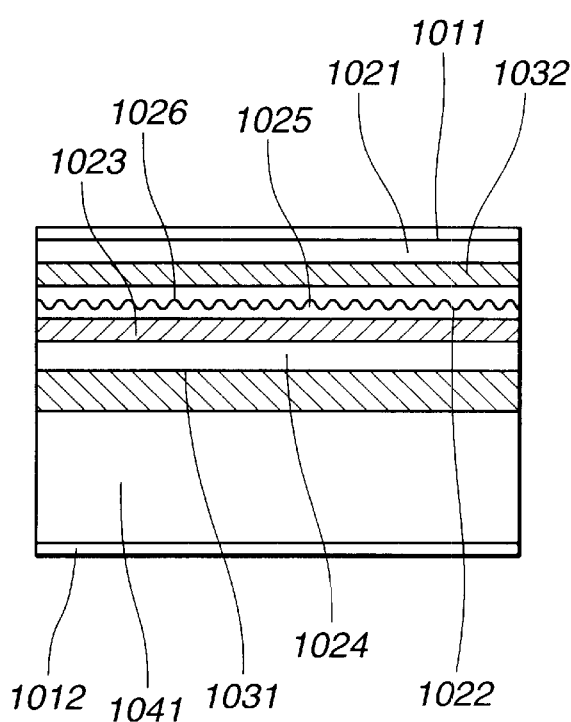
FIG. 15A is a cross-sectional view taken along a cavity-axial direction illustrating an eleventh embodiment of a temperature-insensitive semiconductor laser according to the present invention.
Figure 15B:
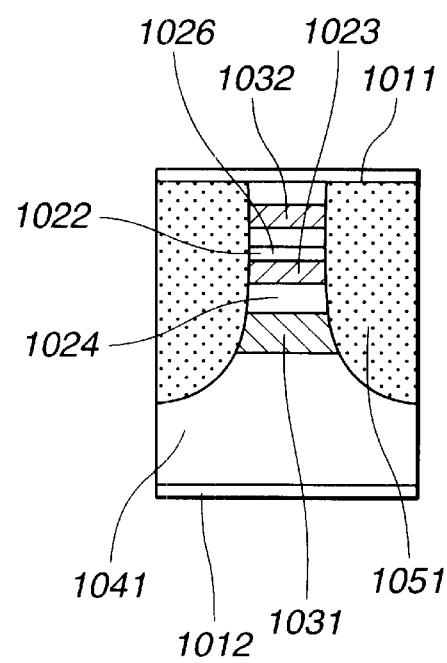
FIG. 15B is a cross-sectional view taken along a direction perpendicular to the cavity-axial direction illustrating the eleventh embodiment.

FIGS. 15A and 15B. illustrate an eleventh embodiment of a temperature-insensitive DFB-LD. In the DFB-LD, an additional upper semiconductor layer 1032 with a negative refractive-index temperature coefficient and an additional lower cladding layer 1026 are laid down over a substrate 1041.

In FIGS. 15A and 15B, reference numerals 1011 and 1012 denote anode and cathode, respectively, reference numeral 1021 denotes an upper cladding layer, reference numerals 1022 and 1024 denote upper and lower light guiding layers, respectively, reference numeral 1023 denotes an active layer, reference numeral 1031 denotes a lower semiconductor layer with a negative refractive-index temperature coefficient, reference numeral 1025 denotes a diffraction grating, and reference numeral 1051 denotes a high-resistance layer. Such layers guiding the propagating light have nearly-zero refractive-index temperature coefficients.

In the structure of the eleventh embodiment, thicknesses of the lower light guiding layer 1024 and the cladding layer 1026 are both set to 1 μm such that no laser light extends to the semiconductor layers 1031 and 1032. As the temperature rises, bandgaps of the semiconductor layers 1031 and 1032 under and above the active layer 1023 are enlarged, and hence, energy barriers for both electrons and holes are enhanced. Therefore, the overflow of carriers can be reduced more greatly than in the tenth embodiment. As a result, the fluctuation in the oscillation threshold current can be lowered in the eleventh embodiment more effectively than in the tenth embodiment. The characteristic temperature of the eleventh embodiment can be raised up to 250 K, while that of the tenth embodiment is 150 K. Thus, a laser with a more excellent temperature characteristic can be realized in the eleventh embodiment.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A semiconductor laser comprising:
   a substrate;
   an active region whose refractive-index temperature coefficient is set at a positive value;
   a semiconductor region whose refractive-index temperature coefficient is set at a negative value.

2. A semiconductor laser according to claim 1, wherein said semiconductor laser has driving means for causing electron-hole recombination in said active region.

3. A semiconductor laser according to claim 1, wherein said active region and said semiconductor region are placed in a growth direction in an approximately parallel manner.

4. A semiconductor laser according to claim 1, wherein said active region and said semiconductor region are formed on an approximately common plane perpendicular to a growth direction and in parallel with each other along a light propagation direction.

5. A semiconductor laser according to claim 1, wherein a plurality of said active regions and a plurality of said semiconductor regions are alternately formed on the common plane in parallel with each other along the light propagation direction.

6. A semiconductor laser according to claim 1, wherein said semiconductor region is formed on at least one of lateral opposite sides of said active region on the common plane in parallel with each other along the light propagation direction.

7. A semiconductor laser according to claim 1, wherein said semiconductor laser is a distributed feedback semiconductor laser.

8. A semiconductor laser according to claim 1, wherein said semiconductor laser is a distributed Bragg reflector semiconductor laser.

9. A semiconductor laser according to claim 1, wherein said active region and said semiconductor region are arranged serially along a light propagation direction.

10. A semiconductor laser according to claim 1, wherein said semiconductor region has a refractive-index temperature coefficient sufficient to achieve the function of approximately maintaining constant the length of said cavity or the effective refractive index of a waveguide at a constant value against a change in temperature of said semiconductor laser.

11. A semiconductor laser according to claim 1, wherein absolute values of refractive-index temperature coefficients of said semiconductor region are all set to be below $10^{-5}K^{-1}$ for a wavelength of laser light radiated in said active region.

* * * * *

UNITED STATES PATENT AND TRADEMARK OFFICE
CERTIFICATE OF CORRECTION

PATENT NO. : 6,501,776 B1
DATED : December 31, 2002
INVENTOR(S) : Takahiro Numai It is certified that error appears in the above-identified patent and that said Letters Patent is hereby corrected as shown below:

Column 1,
Line 52, "well," should read -- well --.

Column 3,
Line 9, "is." should read -- is --.

Column 8,
Line 1, "coefficient a" should read -- coefficient $\alpha$ --; and
Line 17, "except" should read -- except in --.

Column 9,
Line 28, "$\alpha_s \approx 10^{-4}$" should read -- $\alpha_s \approx 10^{-4} K^{-1}$, --; and
Line 29, "$K^{-1}$," should be deleted.

Column 13,
Line 55, "can not" should read -- cannot --.

Column 16,
Line 60, "331)" should read -- 331 --.

Column 17,
Line 54, "guiding," should read -- guiding --.

Column 19,
Line 26, "obtained." should read -- obtained --.

UNITED STATES PATENT AND TRADEMARK OFFICE
CERTIFICATE OF CORRECTION

PATENT NO.    : 6,501,776 B1
DATED         : December 31, 2002
INVENTOR(S)   : Takahiro Numai It is certified that error appears in the above-identified patent and that said Letters Patent is hereby corrected as shown below:

<u>Column 21,</u>
Line 35, "nearly-zero" should read -- near-zero --.

Signed and Sealed this

Eighteenth Day of November, 2003

JAMES E. ROGAN
*Director of the United States Patent and Trademark Office*